United States Patent [19]

Möller et al.

[11] Patent Number: 4,981,722

[45] Date of Patent: Jan. 1, 1991

[54] APPARATUS FOR THE GAS-PHASE PROCESSING OF DISK-SHAPED WORKPIECES

[75] Inventors: Rainer Möller; Dietmar Resch; Lutz Fabian, all of Dresden, Fed. Rep. of Germany

[73] Assignee: VEB Elektromat Dresden, Dresden, Fed. Rep. of Germany

[21] Appl. No.: 378,533

[22] Filed: Jul. 11, 1989

[30] Foreign Application Priority Data

Aug. 12, 1988 [DD] German Democratic Rep. .................................. 3188806

[51] Int. Cl.$^5$ .............................................. C23C 16/50
[52] U.S. Cl. .................. 427/248.1; 156/643; 156/646; 156/345; 118/715; 427/39
[58] Field of Search ................. 118/715, 723; 427/248.1, 39; 156/643, 646, 345

[56] References Cited

U.S. PATENT DOCUMENTS 4,435,445 3/1984 Allred ............................. 427/54.1

FOREIGN PATENT DOCUMENTS 60-166030 8/1985 Japan ................................. 118/728
61-196529 8/1986 Japan ................................ 427/53.1

*Primary Examiner*—Richard Bueker
*Attorney, Agent, or Firm*—Jordan & Hamburg

[57] ABSTRACT

An apparatus for the gas-phase processing of disk-shaped workpieces serves for maintaining cleanliness of the processing space and the workpiece or for avoiding deposits on parts of the workpiece which are not inteded to be coated. In particular a second inner wall system, which is permeable to gas, is provided for the aforementioned purposes. This second inner wall system is associated with a flushing gas system.

4 Claims, 1 Drawing Sheet

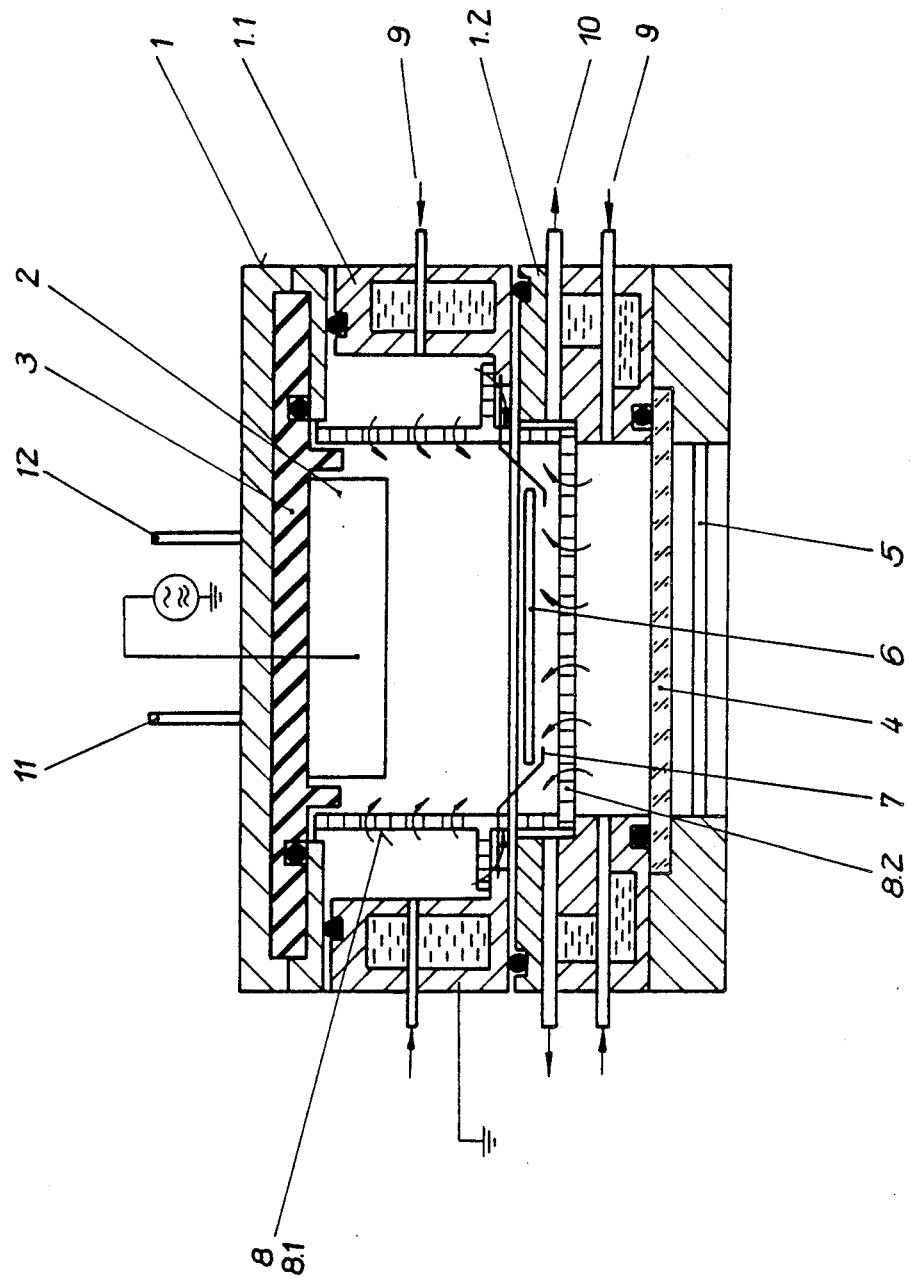

APPARATUS FOR THE GAS-PHASE PROCESSING OF DISK-SHAPED WORKPIECES

BACKGROUND OF THE INVENTION

This invention relates to an apparatus for the gas-phase processing of disk-shaped workpieces. In particular, it serves to lengthen the service life of reactor components during the processing of semiconductor substrates in closed reaction spaces with relative media.

In constructing reactors for the gas-phase processing of disk-shaped substrates, particularly reactors for the chemical deposition from the vapor phase (CVD) or for plasma chemical etching, it is an important objective that conditions for achieving processing effects (such as temperature, distribution of the reaction gas, guidance of the waste gas, plasma density distribution) are produced as far as possible only at the substrate surface that is to be processed and that otherwise the inner walls of the reactor space are spared the processing effects (layer deposition, etching) or the accompanying phenomena of the processing effect (deposition of reaction by-products).

This objective cannot be achieved with conventional reactor constructions. Known solutions, such as heating the substrate by radiant heat, short paths for guiding the gas in the reactor and a local generation of the plasma are necessary partial steps for the solution of this problem. Finite gradients of the distribution functions of the reaction conditions in the reactor always lead to parasitic processing effects outside of the substrate zone.

Deposition of by-products of the reaction is frequently linked to those very conditions, which deviate from those for achieving the desired processing effect. Such conditions generally are present at the reactor walls.

It is an object of the invention to process disk-shaped substrates in high quality and to decrease the work involved in cleaning the reactor required for the gas-phase processing.

SUMMARY OF THE INVENTION

According to the invention there is provided an apparatus for the gas-phase processing of disk-shaped workpieces, which makes possible a considerable increase in the service life of reactors between cleaning steps, the lowering of particle generation during the gas-phase processing and a minimizing of the effects of reaction by-products.

More particularly, this is accomplished by providing the interior space of a reactor for gas-phase processing of disk-shaped substrates with a gas-permeable second wall system, which is disposed at a certain distance from the outer walls of the reactor. This lining is provided wherever reactor parts are not required in an unlined state to accommodate the substrate, to introduce and discharge the process gas or to charge or to generate the plasma. Wherever partial surfaces of the gas-permeable second wall system meet at an angle other than 0° or 180°, there are exhaust channels, which are connected to an exhaust system, which is separate from or can be controlled separately from the process gas exhaust system. Separate gas pipelines for supplying a flushing gas connect the spaces between the outer wall of the reactor and the gas-permeable second wall of the reactor with a supply of gas.

In one embodiment of the invention, the gas-permeable second reactor wall has a plurality of fine boreholes, the outlet openings of which are directed to the exhaust channels associated with the partial surfaces of the gas permeable second wall of the reactor. In a further embodiment of the invention, the gas-permeable second wall of the reactor consists of a sintered, porous, gas-permeable material in the form of a frit. If an inert flushing gas is let in through the gas feed lines into the spaces between the outer wall of the reactor and the gas-permeable second wall of the reactor, it flows through this wall, preferably along the wall and directed to the associated exhaust channels, into the reactor and is removed again by way of the exhaust channels from the reactor.

By means of the gas cushion of the inner wall of the reactor, which is achieved in this manner, parasitic wall effects such as depositions or corrosive attacks are prevented. As a result, the service life between consecutive cleaning cycles is lengthened substantially.

The reactor remains clean for a long time. This brings about substrate processing of high quality, which is expressed, for example, in a substantial absence of particles and in a reduction of the deposition of reaction by-products on the substrate.

A further advantage of the invention consists therein that only the gas-permeable second wall of the reactor, which is disposed so that it is media-tight only in the original reactor, has to be exchanged during clean-up work. The actual reactor, which generally is a vacuum vessel, does not have to be dismantled into its individual parts for the purpose of cleaning.

The presence of a second exhaust system, spatially and functionally separate from the process gas exhaust system, is furthermore advantageous. By adjusting the ratio of the strengths of the exhaustion of the two exhaust systems, the process gas in the reactor can be guided so that a concentration and spatial homogenization of the process gas can be achieved in the area of the substrate.

BRIEF DESCRIPTION OF THE DRAWING

The invention is described in greater detail by reference to a specific embodiment as illustrated in the drawing, which is a section through an apparatus according to the invention.

DETAILED DESCRIPTION OF A PREFERRED EMBODIMENT

The apparatus for the gas-phase processing of disk-shaped workpieces consists of a water-cooled, external, first wall system 1, which is divided for coating purposes into an upper part 1.1 and a lower part 1.2, as a lateral boundary of the reaction space. This space is closed off at the top by an HF electrode 2, which at the same time serves, in conjunction with the process gas inlet 11 and process gas exhaust system 12, for supplying gas and exhausting waste gas. The HF electrode 2 is embedded in the HF insulator 3.

The reaction space is closed off at the bottom by the radiation window 4, which separates the radiant heating system 5 vacuum-tight from the reaction space.

The disk-shaped substrate 6 is on the substrate support 7, which at the same time serves as the ground electrode. The gas-permeable second wall system 8, with its upper part 8.1. and its lower part 8.2, is disposed at distance from the outer, first wall 1 and shields the first wall completely.

The inlets 9 and the exhaust system 10 for the flushing gas, the latter which is constructed and disposed as an annular gap where the gas-permeable second wall system 8 forms an angle of 90°, serve to generate a gas cushion on the inner wall of the gas-permeable second wall system 8. This cushion prevents parasitic depositions or processing effects on the reactor walls, reduces particle infestation of the substrate and increases the service life of the reactor between cleaning cycles.

What we claim is:

1. Apparatus for gas-phase processing of a disk shaped workpiece, comprising a reactor vessel having concentric outer and inner cylindrical walls with an annular space formed therebetween, a cylindrical chamber being laterally bounded by the inner wall, the outer wall being gas impermeable and the inner wall being gas permeable, means for supporting the workpiece concentrically in the cylindrical chamber, gas inlet and gas outlet means for conducting into and out of the cylindrical chamber a gas for treating the workpiece, gas inlet means for conducting a flushing gas into the annular space, the gas permeable inner wall being adapted to conduct the flushing gas from the annular space into the cylindrical chamber, and gas outlet means for conducting the flushing gas out of the cylindrical chamber, the flushing gas outlet means including an annular outlet channel formed at a juncture of walls of the chamber meeting at an acute angle.

2. Apparatus according to claim 1, in which the inner wall is provided with apertures thereby to render it gas permeable.

3. Apparatus according to claim 1, in which the inner wall consists of a sintered, porous frit thereby to render it gas permeable.

4. A method for the gas-phase processing of a disk shaped workpiece, comprising arranging the workpiece concentrically in a cylindrical chamber of a cylindrical reactor vessel having concentric outer and inner cylindrical walls with an annular space formed therebetween and the cylindrical chamber being laterally bounded by the inner wall, the outer wall being gas impermeable and the inner wall being gas permeable, conducting into and out of the cylindrical chamber a gas for treating the workpiece, conducting a flushing gas into the annular space wherefrom the flushing gas flows into the cylindrical chamber through the gas permeable wall, and conducting the flushing gas out of the cylindrical chamber through an annular outlet channel formed at a juncture of walls of the channel meeting at an acute angle.

* * * * *